US012667022B1

(12) United States Patent　　(10) Patent No.:　US 12,667,022 B1
Farjadrad et al.　　　　　　　　(45) Date of Patent:　Jun. 23, 2026

(54) COMPLEX SYSTEM-IN-PACKAGE ARCHITECTURES LEVERAGING HIGH-BANDWIDTH LONG-REACH DIE-TO-DIE CONNECTIVITY OVER PACKAGE SUBSTRATES

(71) Applicant: Eliyan Corporation, Santa Clara, CA (US)

(72) Inventors: Ramin Farjadrad, Los Altos, CA (US); Syrus Ziai, Los Altos, CA (US)

(73) Assignee: Eliyan Corp., Santa Clara, CA (US)

( * ) Notice: Subject to any disclaimer, the term of this patent is extended or adjusted under 35 U.S.C. 154(b) by 0 days.

(21) Appl. No.: 18/396,311

(22) Filed: Dec. 26, 2023

Related U.S. Application Data

(63) Continuation of application No. 17/994,205, filed on Nov. 25, 2022, now Pat. No. 11,855,043, which is a continuation-in-part of application No. 17/737,966, filed on May 5, 2022.

(60) Provisional application No. 63/283,265, filed on Nov. 25, 2021, provisional application No. 63/184,842, filed on May 6, 2021.

(51) Int. Cl.
H10W 90/00 (2026.01)
H10W 72/00 (2026.01)

(52) U.S. Cl.
CPC ........... H10W 90/00 (2026.01); H10W 72/00 (2026.01)

(58) Field of Classification Search
CPC ...... H01L 25/16; H01L 25/165; H10W 90/10; H10W 70/611–618; H10W 70/6528
See application file for complete search history.

(56) References Cited

U.S. PATENT DOCUMENTS

| 4,334,305 | A | 6/1982 | Girardi |
|---|---|---|---|
| 5,396,581 | A | 3/1995 | Mashiko |
| 5,677,569 | A | 10/1997 | Choi |
| 5,892,287 | A | 4/1999 | Hoffman |
| 5,910,010 | A | 6/1999 | Nishizawa |
| 6,031,729 | A | 2/2000 | Berkely |
| 6,055,235 | A | 4/2000 | Blanc |
| 6,417,737 | B1 | 7/2002 | Moloudi |
| 6,690,742 | B2 | 2/2004 | Chan |
| 6,721,313 | B1 | 4/2004 | Van Duyne |
| 6,932,618 | B1 | 8/2005 | Nelson |
| 7,027,529 | B1 | 4/2006 | Ohishi |

(Continued)

OTHER PUBLICATIONS

U.S. Appl. No. 16/812,234; Mohsen F. Rad, filed Mar. 6, 2020.

(Continued)

*Primary Examiner* — Evan G Clinton
(74) *Attorney, Agent, or Firm* — Lance Kreisman; Peninsula Patent Group

(57) ABSTRACT

A multi-chip module (MCM) includes a common substrate and first and second integrated circuit (IC) chips disposed on the common substrate. The first integrated circuit (IC) chip includes a first interface circuit disposed proximate a first edge of the first IC chip and a second interface circuit disposed proximate the first edge of the first IC chip. A first chiplet couples to the first interface circuit via a first link. A second chiplet couples to the second interface circuit via a second link. A first position of the first chiplet with respect to the first IC chip is staggered in a longitudinal dimension relative to a second position of the second chiplet with respect to the first IC chip.

23 Claims, 11 Drawing Sheets

(56)  References Cited

U.S. PATENT DOCUMENTS

| | | |
|---|---|---|
| 7,248,890 B1 | 7/2007 | Raghavan |
| 7,269,212 B1 | 9/2007 | Chau |
| 7,477,615 B2 | 1/2009 | Oshita |
| 7,535,958 B2 | 5/2009 | Best |
| 7,701,957 B1 | 4/2010 | Bicknell |
| 7,907,469 B2 | 3/2011 | Sohn et al. |
| 7,978,754 B2 | 7/2011 | Yeung |
| 8,004,330 B1 | 8/2011 | Acimovic |
| 8,024,142 B1 | 9/2011 | Gagnon |
| 8,121,541 B2 | 2/2012 | Rofougaran |
| 8,176,238 B2 | 5/2012 | Yu et al. |
| 8,483,579 B2 | 7/2013 | Fukuda |
| 8,546,955 B1 | 10/2013 | Wu |
| 8,704,364 B2 | 4/2014 | Banijamali et al. |
| 8,861,573 B2 | 10/2014 | Chu |
| 8,948,203 B1 | 2/2015 | Nolan |
| 8,982,905 B2 | 3/2015 | Kamble |
| 9,088,334 B2 | 7/2015 | Chakraborty |
| 9,106,229 B1 | 8/2015 | Hutton |
| 9,129,935 B1 | 9/2015 | Chandrasekar |
| 9,294,313 B2 | 3/2016 | Prokop |
| 9,349,707 B1 | 5/2016 | Sun |
| 9,379,878 B1 | 6/2016 | Lugthart |
| 9,432,298 B1 | 8/2016 | Smith |
| 9,832,006 B1 | 11/2017 | Bandi |
| 9,843,538 B2 | 12/2017 | Woodruff |
| 9,886,275 B1 | 2/2018 | Carlson |
| 9,934,842 B2 | 4/2018 | Mozak |
| 9,961,812 B2 | 5/2018 | Suorsa |
| 10,171,115 B1 | 1/2019 | Shirinfar |
| 10,402,363 B2 | 9/2019 | Long et al. |
| 10,410,694 B1 | 9/2019 | Arbel |
| 10,439,661 B1 | 10/2019 | Heydari |
| 10,642,767 B1 | 5/2020 | Farjadrad |
| 10,678,738 B2 | 6/2020 | Dai |
| 10,735,176 B1 | 8/2020 | Heydari |
| 10,748,852 B1 | 8/2020 | Sauter |
| 10,769,073 B2 | 9/2020 | Desai |
| 10,803,548 B2 | 10/2020 | Matam et al. |
| 10,804,204 B2 | 10/2020 | Rubin et al. |
| 10,826,536 B1 | 11/2020 | Beukema |
| 10,855,498 B1 | 12/2020 | Farjadrad |
| 10,935,593 B2 | 3/2021 | Goyal |
| 11,088,876 B1 | 8/2021 | Farjadrad |
| 11,100,028 B1 | 8/2021 | Subramaniam |
| 11,164,817 B2 | 11/2021 | Rubin et al. |
| 11,204,863 B2 | 12/2021 | Sheffler |
| 11,789,649 B2 | 10/2023 | Chatterjee et al. |
| 11,841,815 B1 | 12/2023 | Farjadrad |
| 11,842,986 B1 | 12/2023 | Ramin |
| 11,855,043 B1 | 12/2023 | Farjadrad |
| 11,855,056 B1 | 12/2023 | Rad |
| 11,892,242 B2 | 2/2024 | Mao |
| 11,893,242 B1 | 2/2024 | Farjadrad |
| 11,983,125 B2 | 5/2024 | Soni |
| 12,001,355 B1 | 6/2024 | Dreier |
| 2002/0122479 A1 | 9/2002 | Agazzi |
| 2002/0136315 A1 | 9/2002 | Chan |
| 2004/0088444 A1 | 5/2004 | Baumer |
| 2004/0113239 A1 | 6/2004 | Prokofiev |
| 2004/0130347 A1 | 7/2004 | Moll |
| 2004/0156461 A1 | 8/2004 | Agazzi |
| 2005/0041683 A1 | 2/2005 | Kizer |
| 2005/0134306 A1 | 6/2005 | Stojanovic |
| 2005/0157781 A1 | 7/2005 | Ho |
| 2005/0205983 A1 | 9/2005 | Origasa |
| 2006/0060376 A1 | 3/2006 | Yoon |
| 2006/0103011 A1 | 5/2006 | Andry |
| 2006/0158229 A1 | 7/2006 | Hsu |
| 2006/0181283 A1 | 8/2006 | Wajcer |
| 2006/0188043 A1 | 8/2006 | Zerbe |
| 2006/0250985 A1 | 11/2006 | Baumer |
| 2006/0251194 A1 | 11/2006 | Bublil |
| 2007/0281643 A1 | 12/2007 | Kawai |
| 2008/0063395 A1 | 3/2008 | Royle |
| 2008/0086282 A1 | 4/2008 | Artman |
| 2008/0143422 A1 | 6/2008 | Lalithambika |
| 2008/0186987 A1 | 8/2008 | Baumer |
| 2008/0222407 A1 | 9/2008 | Carpenter |
| 2009/0113158 A1 | 4/2009 | Schnell |
| 2009/0154365 A1 | 6/2009 | Diab |
| 2009/0174448 A1 | 7/2009 | Zabinski |
| 2009/0220240 A1 | 9/2009 | Abhari |
| 2009/0225900 A1 | 9/2009 | Yamaguchi |
| 2009/0304054 A1 | 12/2009 | Tonietto |
| 2010/0177841 A1 | 7/2010 | Yoon |
| 2010/0197231 A1 | 8/2010 | Kenington |
| 2010/0294547 A1 | 11/2010 | Hatanaka |
| 2011/0029803 A1 | 2/2011 | Redman-White |
| 2011/0038286 A1 | 2/2011 | Ta |
| 2011/0167297 A1 | 7/2011 | Su |
| 2011/0187430 A1 | 8/2011 | Tang |
| 2011/0204428 A1 | 8/2011 | Erickson |
| 2011/0267073 A1 | 11/2011 | Chengson |
| 2011/0293041 A1 | 12/2011 | Luo |
| 2012/0082194 A1 | 4/2012 | Tam |
| 2012/0182776 A1 | 7/2012 | Best |
| 2012/0192023 A1 | 7/2012 | Lee |
| 2012/0216084 A1 | 8/2012 | Chun |
| 2012/0327818 A1 | 12/2012 | Takatori |
| 2013/0181257 A1 | 7/2013 | Ngai |
| 2013/0222026 A1 | 8/2013 | Havens |
| 2013/0249290 A1 | 9/2013 | Buonpane |
| 2013/0285584 A1 | 10/2013 | Kim |
| 2014/0016524 A1 | 1/2014 | Choi |
| 2014/0048947 A1 | 2/2014 | Lee |
| 2014/0126613 A1 | 5/2014 | Zhang |
| 2014/0192583 A1 | 7/2014 | Rajan |
| 2014/0269860 A1 | 9/2014 | Brown |
| 2014/0269983 A1 | 9/2014 | Baeckler |
| 2015/0012677 A1 | 1/2015 | Nagarajan |
| 2015/0046612 A1 | 2/2015 | Gupta |
| 2015/0172040 A1 | 6/2015 | Pelekhaty |
| 2015/0180760 A1 | 6/2015 | Rickard |
| 2015/0206867 A1 | 7/2015 | Lim |
| 2015/0271074 A1 | 9/2015 | Hirth |
| 2015/0326348 A1 | 11/2015 | Shen |
| 2015/0358005 A1 | 12/2015 | Chen |
| 2016/0056125 A1 | 2/2016 | Pan |
| 2016/0071818 A1 | 3/2016 | Wang |
| 2016/0111406 A1 | 4/2016 | Mak |
| 2016/0217872 A1 | 7/2016 | Hossain |
| 2016/0294585 A1 | 10/2016 | Rahman |
| 2017/0255575 A1 | 9/2017 | Niu |
| 2017/0317859 A1 | 11/2017 | Hormati |
| 2017/0331651 A1 | 11/2017 | Suzuki |
| 2018/0010329 A1 | 1/2018 | Golding, Jr. |
| 2018/0082981 A1 | 3/2018 | Gowda |
| 2018/0137005 A1 | 5/2018 | Wu |
| 2018/0175001 A1 | 6/2018 | Pyo |
| 2018/0190635 A1 | 7/2018 | Choi |
| 2018/0210830 A1 | 7/2018 | Malladi et al. |
| 2018/0315735 A1* | 11/2018 | Delacruz ................. H01L 25/16 |
| 2019/0044764 A1 | 2/2019 | Hollis |
| 2019/0058457 A1 | 2/2019 | Ran |
| 2019/0108111 A1 | 4/2019 | Levin |
| 2019/0198489 A1 | 6/2019 | Kim |
| 2019/0319626 A1 | 10/2019 | Dabral |
| 2020/0051961 A1 | 2/2020 | Rickard |
| 2020/0105718 A1 | 4/2020 | Collins et al. |
| 2020/0257619 A1 | 8/2020 | Sheffler |
| 2020/0373286 A1 | 11/2020 | Dennis |
| 2021/0056058 A1 | 2/2021 | Lee |
| 2021/0082875 A1 | 3/2021 | Nelson |
| 2021/0117102 A1 | 4/2021 | Grenier |
| 2021/0149763 A1 | 5/2021 | Ranganathan |
| 2021/0181974 A1 | 6/2021 | Ghosh |
| 2021/0183842 A1 | 6/2021 | Fay |
| 2021/0193567 A1 | 6/2021 | Cheah et al. |
| 2021/0225827 A1 | 7/2021 | Lanka |
| 2021/0258078 A1 | 8/2021 | Meade |
| 2021/0311900 A1 | 10/2021 | Malladi |
| 2021/0365203 A1 | 11/2021 | O |
| 2022/0051989 A1 | 2/2022 | Agarwal |

(56)            References Cited

U.S. PATENT DOCUMENTS

| | | |
|---|---|---|
| 2022/0159860 A1 | 5/2022 | Winzer |
| 2022/0189934 A1 | 6/2022 | Kim |
| 2022/0223522 A1* | 7/2022 | Scearce ............... H01L 23/5286 |
| 2022/0254390 A1 | 8/2022 | Gans |
| 2023/0039033 A1 | 2/2023 | Zarkovsky |
| 2023/0068802 A1 | 3/2023 | Wang |
| 2023/0090061 A1 | 3/2023 | Zarkovsky |
| 2023/0092541 A1 | 3/2023 | Dugast |
| 2023/0161599 A1 | 5/2023 | Erickson |
| 2023/0181599 A1 | 6/2023 | Du et al. |

OTHER PUBLICATIONS

Universal Chiplet Interconnect Express (UCIe) Specification, Revision 1.1, Version 1.0, Jul. 10, 2023.
Hybrid Memory Cube Specification 2.1, Hybrid Memory Cube Consortium, HMC-30G-VSR PHY, 2014.
Block Memory Generator v8.2 LogiCore IP Product Guide Vivado Design Suite; Xilinx; Apr. 1, 2015.
Kurt Lender et al., "Questions from the Compute Express Link Exploring Coherent Memory and Innovative Cases Webinar", Apr. 13, 2020, CXL consortium.
Planet Analog, "The basics of SerDes (serializers/deserializers) for interfacing", Dec. 1, 2020, Planet Analog.
"Hot Chips 2017: Intel Deep Dives Into EMIB", TomsHardware.com; Aug. 25, 2017.
"Using Chiplet Encapsulation Technology to Achieve Processing-In-Memory Functions"; Micromachines 2022, 13, 1790; https://www.mdpi.com/journal/micromachines; Tian et al.
"Multiport memory for high-speed interprocessor communication in MultiCom;" Scientia Iranica, vol. 8, No. 4, pp. 322-331; Sharif University of Technology, Oct. 2001; Asgari et al.
Farjadrad et al., "A Bunch of Wires (BOW) Interface for Inter-Chiplet Communication", 2019 IEEE Symposium on High-Performance Interconnects (HOTI), pp. 27-30, Oct. 2019.
Universal Chiplet Interconnect Express (UCIe) Specification Rev. 1.0, Feb. 24, 2022.
Brinda Ganesh et al., "Fully-Buffered DIMM Memory Architectures: Understanding Mechanisms, Overheads and Scaling", 2007, IEEE, 2007 IEEE 13th International Symposium on High Performance Computer Architecture, pp. 1-12 (Year: 2007).
Anu Ramamurthy, "Chiplet Technology & Heterogeneous Integration" Jun. 2021, NASA, 2021 NEPP ETW, slides 1-17 (Year: 2021).
Wikipedia, "Printed circuit board", Nov. 9, 2021, Wayback Machine, as preserved by the Internet Archive on Nov. 9, 2021, pp. 1-23 (Year: 2021).

* cited by examiner

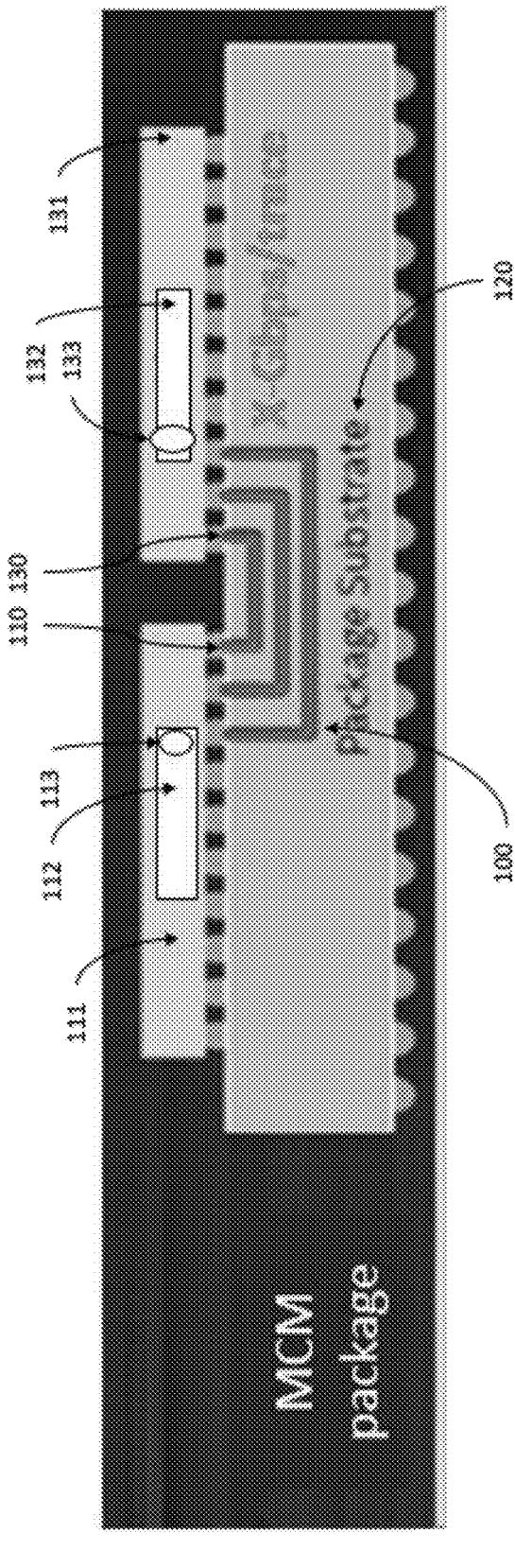

Package 300

Alternative Package 300

Alternative Package 300

Figure 3D:
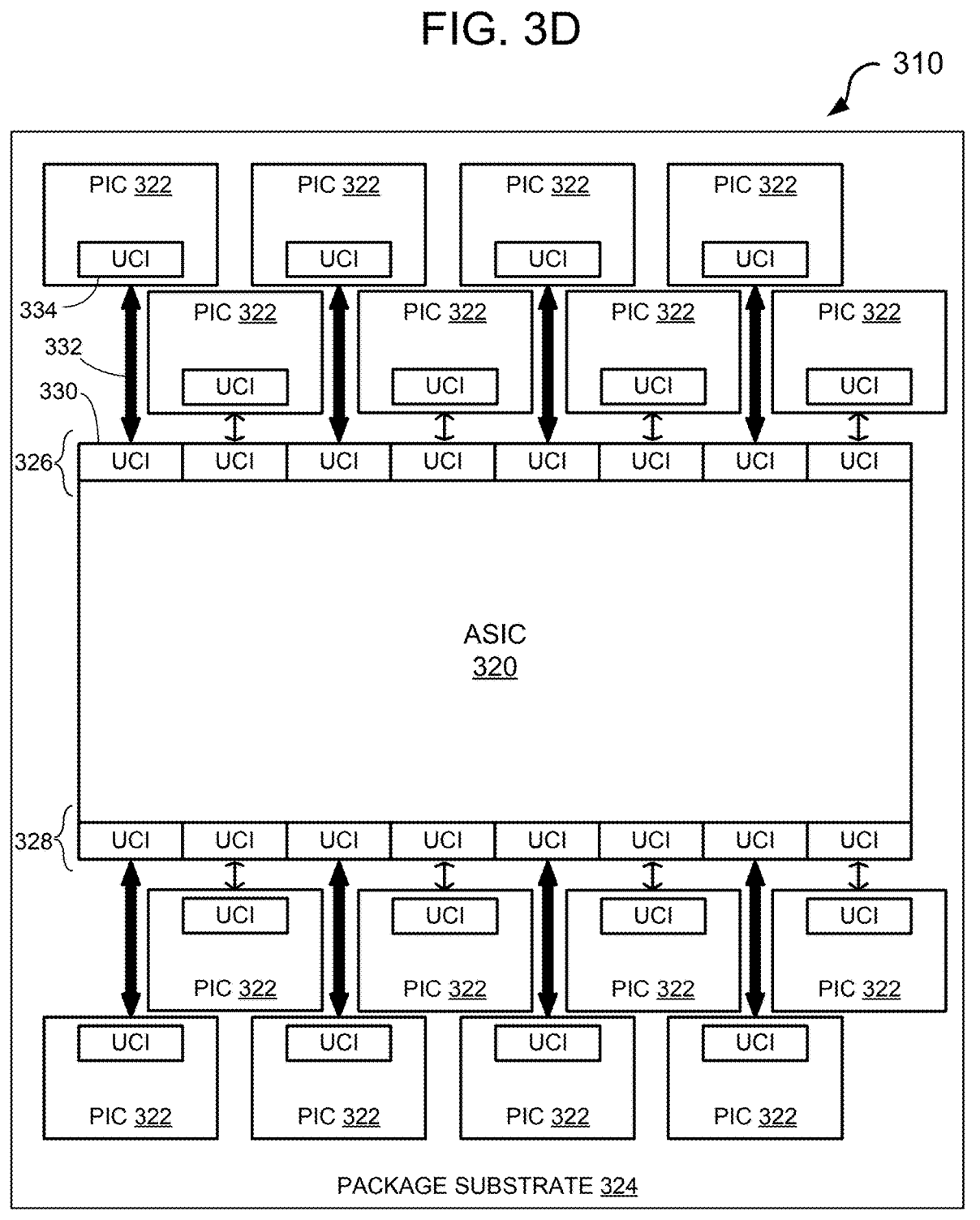

PIC 322 — UCI

PIC 322 — UCI

PIC 322 — UCI

PIC 322 — UCI

334

PIC 322 — UCI

PIC 322 — UCI

PIC 322 — UCI

PIC 322 — UCI

332

330

326 — UCI  UCI  UCI  UCI  UCI  UCI  UCI  UCI

ASIC
320

328 — UCI  UCI  UCI  UCI  UCI  UCI  UCI  UCI

UCI — PIC 322

UCI — PIC 322

UCI — PIC 322

UCI — PIC 322

UCI — PIC 322

UCI — PIC 322

UCI — PIC 322

UCI — PIC 322

PACKAGE SUBSTRATE 324

1

COMPLEX SYSTEM-IN-PACKAGE ARCHITECTURES LEVERAGING HIGH-BANDWIDTH LONG-REACH DIE-TO-DIE CONNECTIVITY OVER PACKAGE SUBSTRATES

INCORPORATED DISCLOSURES

Priority Claim. This Application describes technologies that can be used with embodiments, and other technologies, described in one or more of the following documents. This Application is a Continuation of U.S. patent application Ser. No. 17/994,205, titled "Complex system-in-package architectures leveraging high-bandwidth long-reach die-to-die connectivity over package substrates", filed Nov. 25, 2022, which is a Continuation-In-Part of U.S. patent application Ser. No. 17/737,966, titled "Complex system-in-package architectures leveraging high-bandwidth long-reach die-to-die connectivity over package substrates", filed May 5, 2022, which claims priority to U.S. Provisional Patent Application Ser. No. 63/184,842, titled "Implementing complex system-in-package architectures leveraging high-bandwidth long-reach die-to-die connectivity over MCM package substrates", filed May 6, 2021, and U.S. Provisional Patent Application Ser. No. 63/283,265, filed Nov. 25, 2021, entitled ENABLING ADVANCE SYSTEM-IN-PACKAGE ARCHITECTURES AT LOW-COST USING HIGH-BANDWIDTH ULTRA-SHORT-REACH (USR) CONNECTIVITY IN MCM PACKAGES, all of which are incorporated herein by reference in their entirety.

This application claims priority of the following documents, and all documents which those documents incorporate by reference.

U.S. Provisional Appl. 63/184,842, filed May 6, 2021, in the name of first inventor Syrus Ziai, titled "Implementing complex system-in-package architectures leveraging high-bandwidth long-reach die-to-die connectivity over MCM package substrates".

U.S. Provisional Appl. 63/190,170, filed May 18, 2021, in the name of first inventor Ramin Farjadrad, titled "Novel architecture for DRAM control optimization using simultaneous bidirectional memory interfaces".

U.S. Provisional Appl. 63/283,265, filed Nov. 25, 2021, in the name of first inventor Ramin Farjadrad, titled "Enabling advance system-in-package architectures at low-cost using high-bandwidth ultra-short-reach (USR) connectivity in MCM packages".

U.S. Provisional Appl. 63/295,524, filed Dec. 31, 2021, in the name of first inventor Ramin Farjadrad, titled "Innovative low-cost packaging solutions for system in package and the HBM crossover PHY architecture".

U.S. application Ser. No. 16/812,234, filed Mar. 6, 2020, in the name of first inventor Mohsen F. Rad, titled "Low cost solution for 2.5D and 3D packaging using USR chiplets".

This Application also claims priority of the following documents, and all documents which those documents incorporate by reference.

U.S. Pat. No. 10,572,416, issued Feb. 25, 2020, titled "Efficient signaling scheme for high-speed ultra short reach interfaces".

U.S. Pat. No. 10,642,767, issued May 5, 2020, titled "Efficient signaling scheme for high-speed ultra short reach interfaces".

U.S. Pat. No. 10,552,353, issued Feb. 4, 2020, titled "Simultaneous bidirectional serial link interface with optimized hybrid circuit".

U.S. Pat. No. 10,855,498, issued Dec. 1, 2020, titled "Efficient signaling scheme for high-speed ultra short reach interfaces".

U.S. application Ser. No. 16/365,510, filed Mar. 26, 2019, titled "Multi-chip module with configurable multi-mode serial link".

U.S. application Ser. No. 16/867,442, filed May 5, 2020, titled "Efficient signaling scheme for high-speed ultra short reach interfaces".

U.S. application Ser. No. 17/108,519, filed Dec. 1, 2020, titled "Efficient signaling scheme for high-speed ultra short reach interfaces".

U.S. application Ser. No. 17/521,612, filed Oct. 8, 2021, titled "Efficient signaling scheme for high-speed ultra short reach interfaces".

These documents are hereby incorporated by reference as if fully set forth herein. Techniques described in this Application can be elaborated with detail found therein. These documents are sometimes referred to herein as the "Incorporated Disclosure," the "Incorporated Document," or variants thereof.

COPYRIGHT NOTICE

BACKGROUND

This background is provided as a convenience to the reader and does not admit to any prior art or restrict the scope of the disclosure or the invention. This background is intended as an introduction to the general nature of technology to which the disclosure or the invention can be applied.

Systems of circuits that are integrated onto a single chip, sometimes called "systems on a chip", and related terms, often involve a very large number of circuit elements being constructed on a single silicon die. As systems on a chip become more complex, it is often desirable to integrate more circuit elements on a silicon die. One way to increase the number of circuit elements on a silicon die is to make those circuit elements smaller.

A desire to make circuit elements smaller prompts the development of process technology that allows construction of circuit elements that have smaller dimensions, such as side lengths and widths. However, one problem that has arisen in the art is that smaller circuit elements involve more careful control of construction and placement of those circuit elements. Moreover, process technology has not been able to keep up with market desires to reduce the size of circuit elements. This has led to a desire for other solutions that are not subject to such drawbacks.

One proposed solution has been to make individual chips that each do not involve so many individual circuit elements, sometimes called "chiplets", and to combine those chiplets into a system having multiple such chiplets. While this proposed solution can provide the ability to create systems that have a sufficient number of circuit elements, it poses the problem that communication between those circuit elements can be limited by a number of connecting wires between chiplets.

Accordingly, one proposed method for coupling multiple such chiplets has been to provide a silicon "interposer", which is a silicon chip used as a substrate that is coupled to more than one distinct chiplet. While this proposed solution can provide communication between circuit elements on distinct chiplets, silicon interposers can involve a very large number of communication wires to be coupled between distinct chiplets. These communication wires might involve complex routing and/or dense layout within the silicon interposer. Silicon interposers might also need to be limited with respect to power consumption, which can limit the amount of communication bandwidth they can provide between distinct chiplets. This has led to a desire for other solutions that are not subject to such drawbacks.

One problem that has arisen in the art is that the silicon interposer being a silicon chip itself has a limited size, defined by the size of semiconductor mask reticle. Maximum manufacturable size of a silicon interposer is still significantly smaller than a conventional organic substrate. This size limitation limits the number of chiplets that can be integrated together in a package, and therefore limits the complexity and performance of the system in package.

Another proposed solution is EMDIB, an embedded interconnected communication link (sometimes called a "bus") proposed by Intel Corporation. While this proposed solution can provide a different technique for communication between circuit elements on distinct chiplets, it is very complex to manufacture and also proprietary to Intel. This has led to a desire for other solutions that are not subject to such drawbacks.

Each of these issues, as well as other possible considerations, might relate to aspects of coupling distinct chips and distinct chiplets that is not subject to the drawbacks described herein, not subject to other drawbacks not otherwise described herein, and related matters.

BRIEF DESCRIPTION OF THE FIGURES

In the figures, like references generally indicate similar elements, although this is not strictly required.

FIG. 1 shows a conceptual drawing of a system including an interface between a first and a second chiplet using a package substrate.

FIG. 3 (collectively including FIGS. 3A-3F) shows a conceptual drawing of a system including multiple computing devices coupled to each other and to one or more of: (FIG. 3D) a relatively large number of staggered photonic (optical) devices using a set of physical interconnects with longer reach.

Figure 2A:
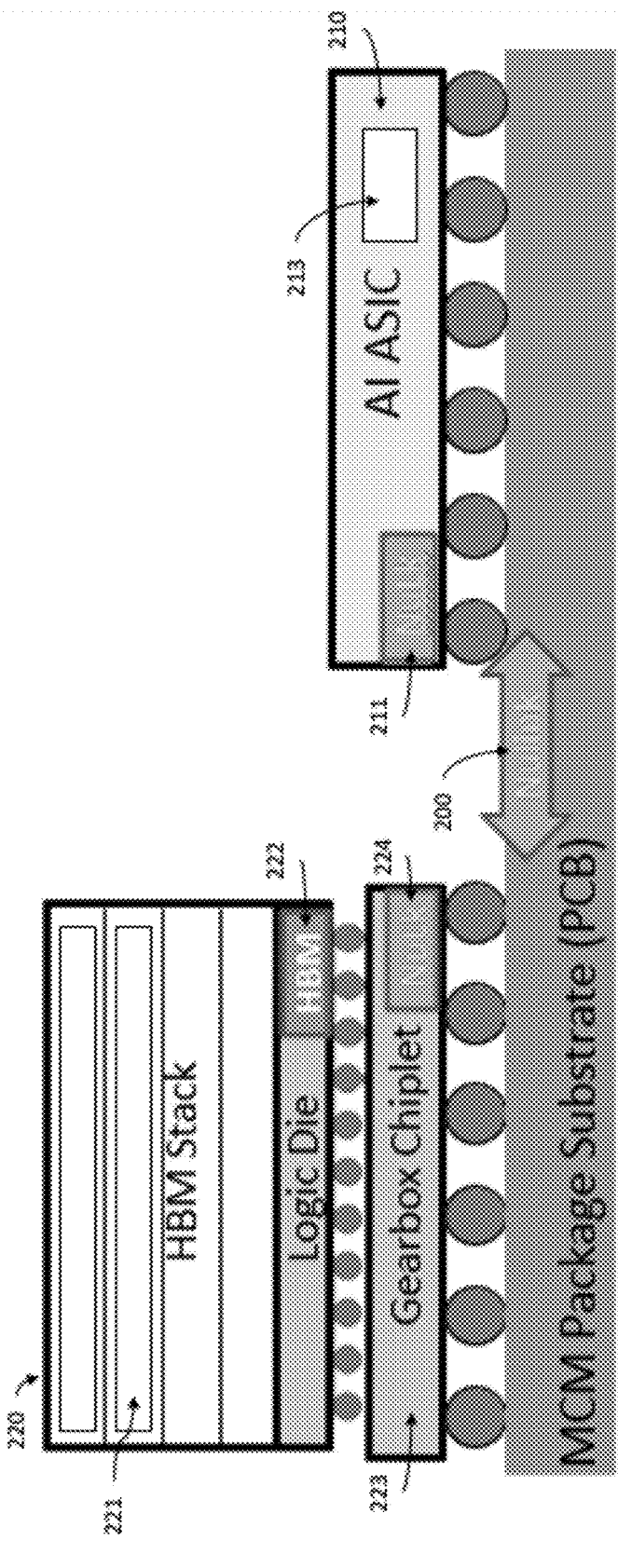
FIG. 2 (collectively including FIGS. 2A-2E) shows a conceptual drawing of a system including an interface between a computing device and a memory device using circuit logic and a package substrate. The circuit logic can include (FIG. 2A) a separate chiplet to interface with the physical interconnect, (FIG. 2B) a combination logic die and physical interconnect interface, or other alternative embodiments as shown in FIGS. 2C-2E.

After reading this Application, those skilled in the art would recognize that the figures are not necessarily drawn to scale for construction, nor do they necessarily specify any particular location or order of construction.

DETAILED DESCRIPTION

General Discussion

Among other disclosures, this Application describes a system, and techniques for use, capable of a physical layer interconnect between distinct chips and distinct chiplets that can provide relatively high bandwidth communication with relatively low power requirements.

In one embodiment, the described physical layer interconnect can be disposed to interface with known physical interconnects and with interfaces already used by known chips and chiplets. Alternatively, the described physical layer interconnect can be disposed in a system including an interface between a first and a second chiplet using a separate chiplet to interface with the physical interconnect or using a logic die (sometimes referred to herein as a "chiplet") with an embedded physical interconnect interface; in either case, a computing device can be disposed to interface with a memory device using the described physical layer interconnect, whether or not the two devices were originally designed to use the described physical layer interconnect.

In one embodiment, the described physical layer interconnect can be disposed to couple to multiple computing devices to each other, and to couple each of the computing devices to a set of external devices. Thus, each of the multiple computing devices can be coupled to a substantially larger number of memory devices; to an expandable set of additional circuit elements, such as possibly memory devices or slots for coupling external devices; or to one or more hybrid interfaces between one or more of the computing devices and an external pool of other devices.

In one embodiment, the described physical layer interconnect can be disposed to couple a set of possibly different computing devices and a set of possibly different memory devices in a rack configuration, such as coupling one or more central processing units (CPUs) or otherwise general processing devices or one or more graphics processing units (GPUs) or otherwise specialized processing devices. For example, the specialized processing devices can include one or more tensor processing units (TPUs), video processing units (VPUs), or other devices disposed for specialized processing techniques. The set of possibly different computing devices can be disposed to be coupled to generalized memory devices or to memory devices specialized for operation with one or more specialized processing devices.

In one embodiment, the computing devices described herein can include an application-specific integrated circuit (ASIC), a processor, a system-on-a-chip, a floating-point gate array (FPGA), another type of computing device that can interface with one or more memory devices, or a combination or conjunction of multiple ones or multiple types of such devices.

In one embodiment, the memory devices described herein can include a high-bandwidth memory (HBM), a dynamic RAM (DRAM), static RAM (SRAM), a memory cache, a multi-level memory such as including one or more levels of cache and a memory device, a database, another type of memory device that can interface with one or more devices, or a combination or conjunction of multiple ones or multiple types of such devices.

Terms and Phrases

The following terms and phrases are exemplary only, and not limiting.

The phrases "this application", "this description", and variants thereof, generally refer to any material shown or suggested by any portions of this Application, individually or collectively, and including all inferences that might be drawn by anyone skilled in the art after reviewing this Application, even if that material would not have been apparent without reviewing this Application at the time it was filed.

The phrases "computing device", and variants thereof, generally refer to any device (or portion thereof) that might be disposed to issue read and/or write commands to a "memory device", such as described herein, or multiple ones or multiple types of such memory devices, whether in parallel or series, whether to one or more separate or banks thereof, whether to a distributed or singular such device, whether to a logically local or remote such device, or otherwise as described herein. For example, the computing device can include an application-specific integrated circuit (ASIC), a processor, a system-on-a-chip, a floating-point gate array (FPGA), another type of computing device that can interface with one or more memory devices, or a combination or conjunction of multiple ones or multiple types of such devices.

The phrases "memory device", and variants thereof, generally refer to any device (or portion thereof) that might be disposed to receive read and/or write commands from a "computing device", such as described herein, or multiple ones or multiple types of such computing devices, whether in parallel or series, whether to one or more separate or banks thereof, whether to a distributed or singular such device, whether from a logically local or remote such device, or otherwise as described herein. For example, the memory device can include a dynamic RAM (DRAM), static RAM (SRAM), a memory cache, a multi-level memory such as including one or more levels of cache and a memory device, a database, another type of memory device that can interface with one or more devices, or a combination or conjunction of multiple ones or multiple types of such devices.

The phrases "communication link", "communication bus" and variants thereof, generally refer to any device (or portion thereof) that might be disposed to send information from a first device to a second device, whether or not that information is retained at the first device, whether or not that information is acknowledged or assured to be received by the second device, whether or not that information undergoes substantial delay or is transmitted by intermediate devices, or otherwise as described herein. For example, a communication link can include an electrical, optical, or electro-optical coupling between the first and second devices, a circuit-switched or packet-switched network including the first and second devices, a redundant modular or otherwise reliable distributed communication system, or otherwise as described herein.

After reviewing this Application, those skilled in the art would recognize that these terms and phrases should be interpreted in light of their context in the specification.

FIGURES AND TEXT

FIG. 1—Interface Using a Package Substrate

FIG. 1 shows a conceptual drawing of a system including an interface between a first and a second chiplet using a package substrate.

In one embodiment, a physical interconnect 100 can be disposed between a first interface 110 disposed on a first chiplet 111, through a package substrate 120 or other support structure, and a second interface 130 disposed on a second chiplet 131.

As described in the Incorporated Disclosures, the physical interconnect 100 can be disposed to communicate using an organic substrate such as a printed circuit board (PCB) between first circuit elements 112 on the first chiplet 111, using first physical interconnect circuit elements 113, and second circuit elements 132 on the second chiplet 131, using a second set of physical interconnect circuit elements 133. Whenever the first circuit elements 112 communicate with the second circuit elements 132, communication can occur using the physical interconnect 100, thus between the first circuit elements 112, the first physical interconnect circuit elements 113, the actual physical interconnect 100, the second physical interconnect circuit elements 133, and the second circuit elements 132.

Accordingly, the first circuit elements 112 and the second circuit elements 132 need not know they are not located on the same chiplet. Communication using the physical interconnect 100 might be somewhat less closely tied than direct connection on the same chiplet. However, otherwise communication between the first circuit elements 112 and the second circuit elements 132, so long as they use a protocol specified for using the physical interconnect 100, should have no substantial difference from communication on the same chiplet.

This can have the effect that the first circuit elements 112 and the second circuit elements 132 can collectively operate substantially as if they were disposed on the same chiplet, without substantial difference except for the possibly of communication that is somewhat less closely tied. Thus, communication might have slightly less bandwidth or slightly greater latency, but otherwise communication should be substantially identical, so long as the first circuit elements 112 and the second circuit elements 132 use a protocol specified for using the physical interconnect 100.

In one embodiment, communication using the physical interconnect 100 can include a communication bandwidth of about 10 gigabits/second (Gbps) per trace, with relatively low power involved for using the physical interconnect 100. This can have the effect that communication between the multiple chiplets need not involve a silicon interposer that is either (A) as large as both chiplets collectively, or (B) specially designed for communication between the multiple chiplets. Moreover, a system using the multiple chiplets can have relatively complete test coverage and need not be substantially limited by cooling or routing requirements.

FIG. 2—Interface Using Computing Device and a Package Substrate

FIG. 2 (collectively including FIGS. 2A-2E) shows a conceptual drawing of a system including an interface between a computing device and a memory device using an organic package substrate such as a printed circuit board (PCB). The interface can include (FIG. 2A) a logic die having a physical interface coupled to the memory device and a separate "gearbox" chiplet disposed to couple that physical interface with the physical interconnect or (FIG.

2B) a logic die and physical interconnect interface. Further embodiments are shown in FIGS. 2C, 2D and 2E.

The description with respect to this figure is to be regarded as supplemented with the Incorporated Disclosures, including at least, but not limited to, one or more of the following:

U.S. Provisional Appl. 63/184,842, filed May 6, 2021, in the name of inventors Syrus Ziai and Ramin Farjadrad, titled "Implementing complex system-in-package architectures leveraging high-bandwidth long-reach die-to-die connectivity over MCM package substrates".

U.S. Provisional Appl. 63/295,524, filed Dec. 31, 2021, in the name of first inventor Ramin Farjadrad, titled "Innovative low-cost packaging solutions for system in package and the HBM crossover PHY architecture".

Separate Chiplet to Interface with Physical Interconnect

FIG. 2A shows a conceptual drawing of a system including a logic die having a physical interface coupled to the memory device and a separate "gearbox" chiplet disposed to couple that physical interface with the physical interconnect.

In one embodiment, a computing device disposed on a first chiplet 210 can include first computing elements disposed to perform the functions of the computing device. The circuit elements disposed on the first chiplet 210 can include first physical interconnect circuit elements 211 (such as physical interconnect circuit elements) coupled to a physical interconnect 200. The physical interconnect 200 can be disposed to couple chiplets using an organic package substrate 201, such as a printed circuit board (PCB).

In one embodiment, a memory device 220, such as a high-bandwidth memory (HBM) stack including one or more memory chiplets 221, can include an interface logic die 222 disposed with the HBM stack and including an HBM interface circuit 222 disposed to couple the HBM stack to the computing device (as described, disposed on a first chiplet 210).

The HBM interface circuit 222 can be coupled to a "gearbox chipset" 223 disposed to couple to the HBM interface circuit 222 and to translate the interface implemented by the HBM interface circuit 222 to the protocol specified for using the physical interconnect 200.

The gearbox chipset 223 can include second physical interconnect circuit elements 224, disposed to implement the protocol specified for using the physical interconnect 200. The first physical interconnect circuit elements 211 and the second physical interconnect circuit elements 224 can be coupled using the physical interconnect 200 and can collectively implement a physical interconnect protocol.

Accordingly, the memory device 220 can be disposed to interface with the computing device (as described, disposed on a first chiplet 210) using the physical interconnect 200. Therefore, the memory device 220 can connect with the computing device (as described, disposed on a first chiplet 210) over a conventional organic substrate, as opposed to advanced-packaging substrates such as silicon interposer that have many negatives, such as limited size, limited physical interface reach, and very fine trace and pad pitch. For example, the largest silicon today is approximately 2000 mm² in size, its physical interface reach is less than 4 mm, and its pad and trace pitch is less than 50 um, while an organic substrate can be 10,000 mm² in size, its physical interface reach to be greater than 20 mm or more, and its pad and trace pitch is greater than 100 um. Thus, the memory device 220 can couple to the computing device (as described, disposed on a first chiplet 210) using the physical interconnect 200 over the organic substrate, without requiring a silicon interposer.

Combination Logic Die and Physical Interconnect Interface

Figure 2B:
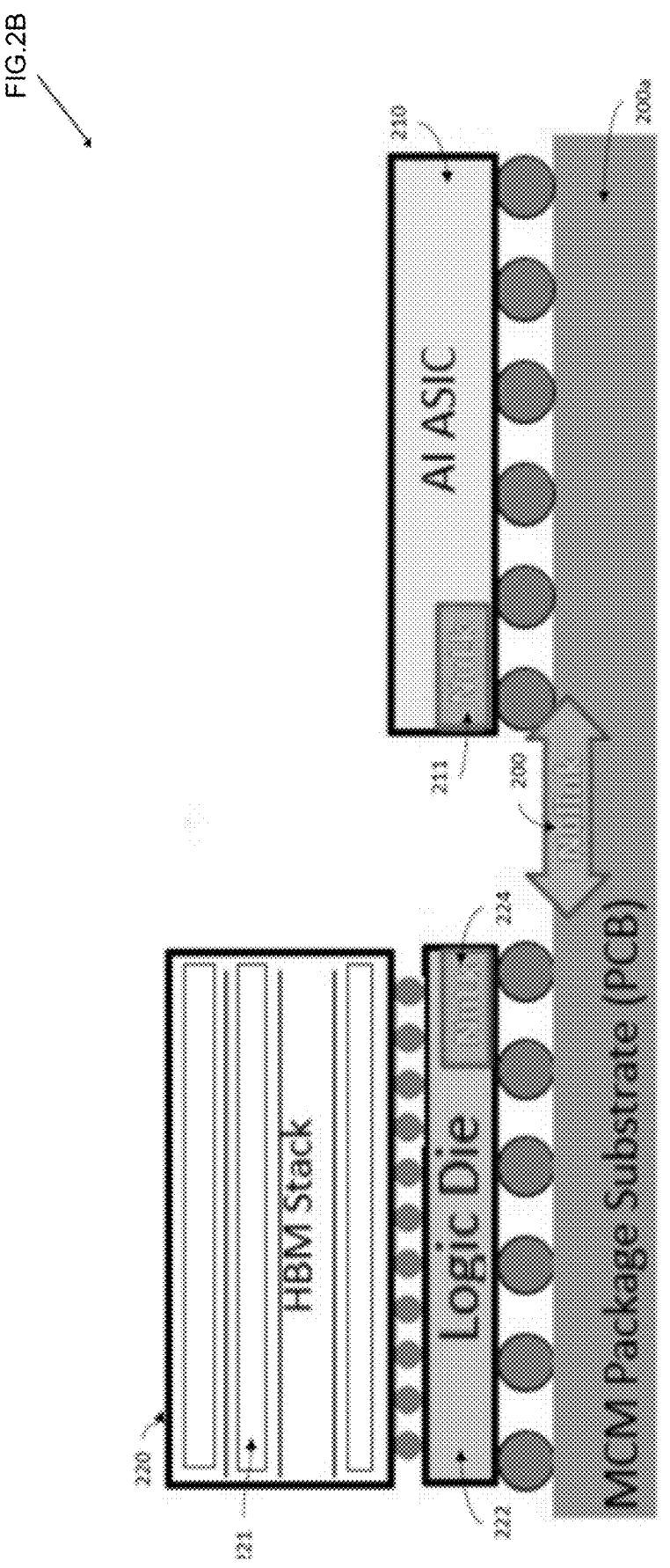
Figures 2C, 2D:
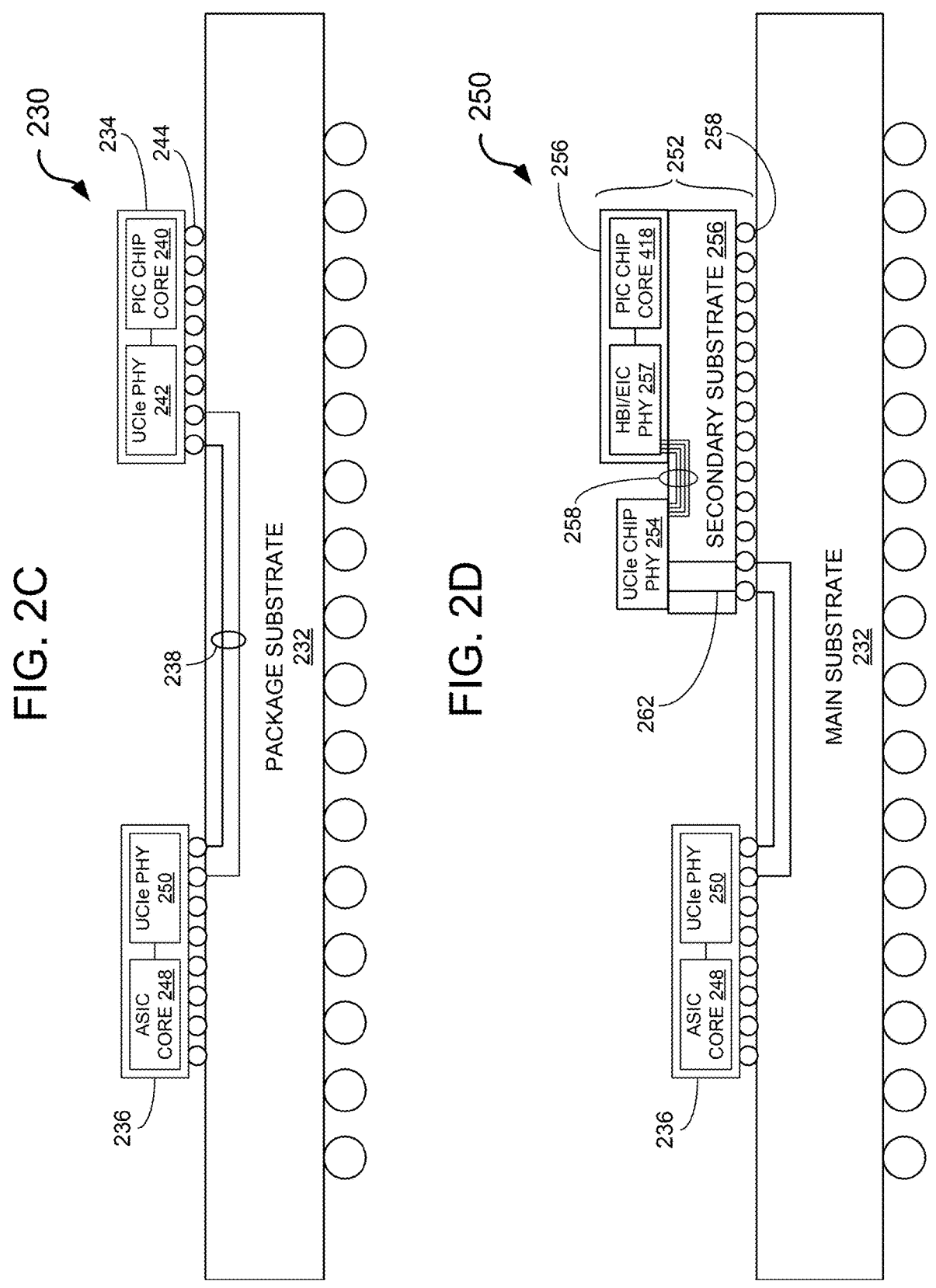
Figure 2E:
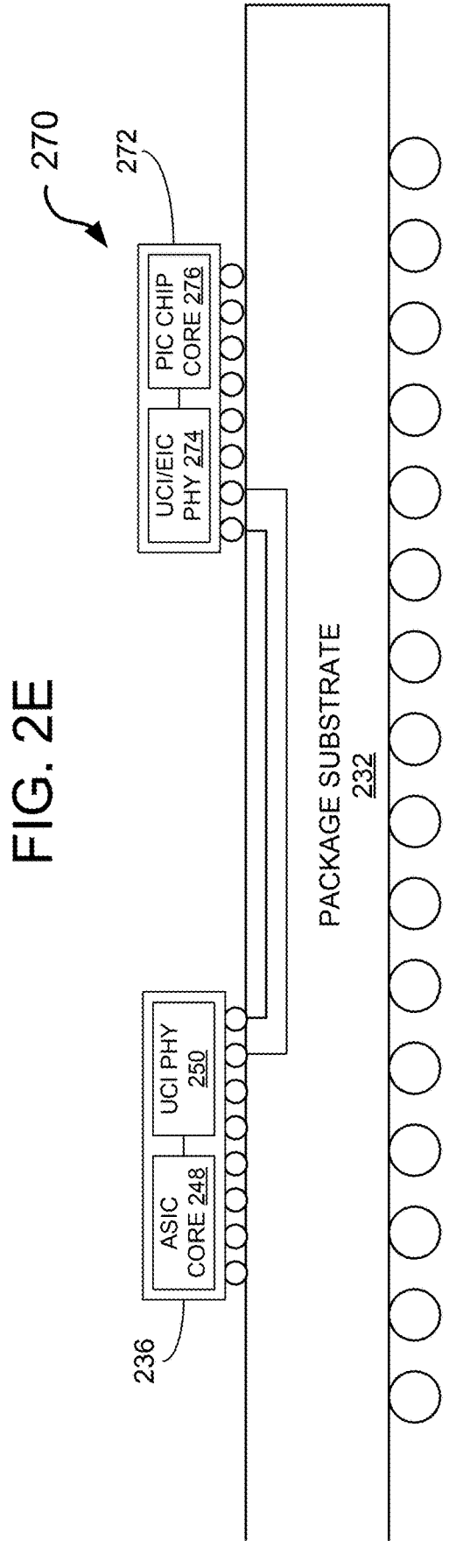

FIG. 2B shows a conceptual drawing of a system including a combination logic die and physical interconnect interface.

In one embodiment, a computing device similarly disposed on a first chiplet 210 can include first computing elements disposed to perform the functions of the computing device. The circuit elements disposed on the first chiplet 210 can similarly include first physical interconnect circuit elements 211 coupled to a physical interconnect 200.

In one embodiment, a memory device 220, such as a high-bandwidth memory (HBM) stack including one or more memory chiplets 221 can include a logic die 222 disposed with the HBM stack and including physical interconnect circuit elements 224 disposed to couple the memory device 220 to the computing device. The physical interconnect circuit elements 224 can be disposed to be coupled to corresponding physical interconnect circuit elements 211 disposed at the computing device, using a physical interconnect 200 coupling chiplets using an organic package substrate 201, such as a printed circuit board (PCB).

Accordingly, the computing device can be disposed to communicate with the memory device 220 using the first physical interconnect circuit elements 211, the physical interconnect 200, and the second physical interconnect circuit elements 224. Thus, the memory device 220 can couple to the computing device (as described, disposed on a first chiplet 210) using the physical interconnect 200 over the organic substrate, without requiring a silicon interposer.

In one embodiment, the logic die 222 can include a network interface and (optionally) a computing device.

For example, the logic die 222 can include an additional computing device and a network interface device disposed thereon. The additional computing device (disposed on the logic die 222) can be disposed to interface with the memory device 220 by receiving and responding to computing commands/controls from the computing device (as described, disposed on a first chiplet 210), using the memory device 220 as its memory device. For one example, the additional computing device (disposed on the logic die 222) can receive database commands/controls from the computing device (as described, disposed on a first chiplet 210), translate those database commands/controls into memory device read/write commands, issue those memory device read/write commands to the memory device 220, translate responses from the memory device 220 into memory device read/write responses, and respond to the computing device (as described, disposed on a first chiplet 210) with those memory device read/write responses. In such cases, the logic die 222 can provide a database interface to the memory device 220 even when the memory device 220 is not so disposed to perform those functions by itself.

The logic die 222 can also include a network interface disposed to route computing and/or memory commands/responses, such as for example read/write commands, between the memory device 220 and other devices. For example, as described herein, the logic die 222 can be disposed to route read/write commands between multiple memory devices 220, to allow those memory devices 220 to be coupled to one or more computing devices (such as described, disposed on a first chiplet 210) without being directly connected thereto. In such cases, one or more computing devices (as described, disposed on a first chiplet 210) can be coupled to multiple such memory devices 220, with one or more such logic dice 222 disposed to route read/write commands (and associated read/write data) between those computing devices (as described, disposed on a first chiplet 210) and the memory devices 220 maintaining the target memory associated with those read/write commands.

In one embodiment, the D2D physical interconnects 100 coupling the computing devices and the memory devices 220 can be disposed to route memory commands/requests to selected memory devices 220 as indicated by the computing devices (as described, disposed on a first chiplet 210). Thus, one or more of the computing devices (as described, disposed on a first chiplet 210) can issue a read/write command to one or more of the memory devices 220, even if the memory device 220 which is a target of the read/write command is not directly coupled to the issuing computing device (as described, disposed on a first chiplet 210). This can have the effect that the computing devices (as described, disposed on a first chiplet 210) can access selected memory devices 220 even when those selected memory devices 220 are not directly coupled to those computing devices (as described, disposed on a first chiplet 210).

Multi-Chip Module (MCM) with Photonic Chiplet Coupled to ASIC

FIG. 2C shows a conceptual drawing of a multi-chip module (MCM) 230 including a package substrate 232 that mounts a first semiconductor device 234 that communicates with a second semiconductor device 236 via a long-reach interconnect that has a relatively large cross section 238. The large cross section helps reduce the resistance of the interconnect, and thus allow for its long reach. For one embodiment, the first semiconductor device 234 takes the form of a single integrated circuit (IC) die, or chiplet, and includes photonic circuitry 240 coupled to a first interface adapter circuit 242 such as a Universal Chiplet Interconnect Express (UCIe) physical interconnect interface. While not shown, the photonic circuitry 240 includes an optical interface for coupling to one or more optical fibers. For one embodiment, the first semiconductor device 234 is packaged with a relatively low-density external interface of mechanical bumps, at 244, that allows for the use of high-speed and relatively long-reach links as the interconnects 238 for coupling to the UCIe interface 242. For one specific embodiment, a bump-to-bump pitch of the connection interface 244 is on the order of 130 micrometers. As more fully explained below, the ability to employ the long-reach links 238 allows for multiple semiconductor devices, such as photonic chiplets, to be staggered in a high-density topology on the MCM 230 with respect to the second semiconductor device 236.

With continued reference to FIG. 2C, in some embodiments, the photonic circuitry 240 incorporates an electronic interface circuit (EIC) that includes advanced logic for performing optical-to-electrical signal conversions and vice-versa. In such embodiments, the EIC circuitry couples to the first interface adapter circuit 242, which carries out interface conversions between the two circuits such that the first semiconductor device 234 is able to communicate with the second semiconductor device 236.

Further referring to FIG. 2C, for one embodiment, the second semiconductor device 236 includes application specific integrated circuit (ASIC) core logic 248 coupled to a second interface adapter circuit 250 that is compatible with the first interface adapter circuit 242 of the first semiconductor device 234. The high-speed and relatively long-reach links 238 provide high-bandwidth connectivity per bump of the packaged semiconductor devices 234 and 236. As a result, the package substrate 232 for mounting the semiconductor devices 234 and 236 and for routing the links 238 may take the form of a relatively inexpensive package substrate, such as an organic or non-silicon substrate. This, in-turn, allows the MCM 230 to provide chip-to-chip communications without the need for an expensive silicon-based substrate, such as a silicon interposer.

Multi-Chip Module (MCM) with Photonic Chiplet Assembly Coupled to ASIC

FIG. 2D shows a conceptual drawing of a multi-chip module (MCM) 250 that is similar to the MCM 230, employing a similar second semiconductor device 236 and package substrate 232. The MCM 250 includes a first semiconductor assembly 252 that disaggregates the Universal Chiplet Interconnect Express (UCIe) physical interconnect interface of FIG. 2C as a separate gearbox adapter chiplet 254 that is separate from a photonic chiplet 256 in a 2.5D physical layout. For one embodiment, the photonic chiplet 256 includes EIC circuitry and a high-bandwidth interconnect (HBI) interface 257, where the HBI interface is a wide interface operating at a relatively low-baud rate over many wires that are spaced at a relatively high density. The gearbox adapter chiplet 254 employs a primary interface that couples to the HBI interface, and a secondary interface that, for one embodiment, takes the form of the UCIe interface. Conversion circuitry within the gearbox adapter chiplet 254 performs interface conversions between the interfaces.

Further referring to FIG. 2D, for one embodiment, the photonic chiplet 256 and the interface adapter chiplet 254 are both mounted in a horizontal relationship with each other on a secondary substrate 256. The secondary substrate 256 includes an array of contacts or bumps 258 that connect the secondary substrate 256 to the main package substrate 232. For some embodiments, the secondary substrate 256 may be formed as a silicon interposer, or as a non-silicon substrate formed, for example, as an epoxy-based mold material in a high-density fan-out (HDFO) process or a wafer-level fan-out (WLFO) process. The secondary substrate 256 provides for high-pitch and high-density signaling paths or traces, at 258, formed, for example, in an oxide layer of the mold material between the first chip interface 257 and the interface adapter chiplet 254. For some embodiments, through-vias may be formed through the mold material, at 262, to provide low-density and high-bandwidth connections between the interface adapter chiplet 254 and the main package substrate 232.

Multi-Chip Module (MCM) with a Disaggregated EIC Circuit

FIG. 2E shows a conceptual drawing of an MCM 270 that is similar to the MCM 250, employing a similar second semiconductor device 236 and package substrate 232. The MCM 270 includes a first semiconductor assembly 272 that not only disaggregates the adapter interface as a separate adapter chiplet 274, but also includes EIC circuitry within the adapter chiplet 274 that is separate from a photonic chiplet 276 in a 2.5D physical layout. As noted above, the EIC circuitry generally includes advanced logic that is more suitable for an advanced logic manufacturing process, similar to the gearbox logic. The photonic logic, on the other hand, is more suitable to a less-advanced manufacturing process. By disaggregating the different forms of logic, the photonic chip may be less costly since it may avoid the more advanced manufacturing steps associated with the advanced logic process. Additionally, in many cases, implementing the very high-speed EIC circuits on the photonic chiplet 276 is either impractical or if practical, leads to very high-power implementations. Adding the EIC circuitry to the gearbox logic with the advanced logic process not only minimally impacts the cost of the gearbox chiplet, but delivers a very lower-power combined solution. As a result, manufacturing costs associated with the first semiconductor assembly may be reduced. In some proposed prior art, the EIC is implemented in the second semiconductor device 236, which also include advanced logic process, however, the very high-speed signals between the EIC and PIC can be attenuated if the coupling traces are long. In the latter configuration, the photonic chip 279 either needs to be placed close to the ASIC chip 236, which limits the routability and placement of the chiplets in the MCM, or the PIC chiplet needs to have high-speed equalization circuits that lead to high power and complexity.

FIG. 3—Computing Devices and Additional Interfaces

FIG. 3 (collectively including FIGS. 3A-3F) shows a conceptual drawing of a system including one or more computing devices coupled to one or more of: (FIG. 3A) a relatively larger number of memory devices using a set of physical interconnects; (FIG. 3B) an expandable set of additional memory devices and/or other circuit elements; (FIG. 3C) a set of hybrid interfaces between one or more of the computing devices and an external pool of other devices; (FIG. 3D) a relatively larger number of photonic devices disposed in a staggered topology using a set of physical interconnects; (FIG. 3E) a larger number of generic chiplets disposed in a staggered topology; or (FIG. 3F) a relatively larger number of photonic devices disposed in a fanout topology using a set of physical interconnects.

Coupling to Relatively Larger Set of Physical Interconnects

Figure 3A:
(FIG. 3A) a relatively larger number of staggered memory devices using a set of physical interconnects with longer reach.

FIG. 3A shows a conceptual drawing of a system including multiple computing devices coupled to each other and to a relatively larger of memory devices using a set of physical interconnects.

In one embodiment, a package 300 includes one or more of the following:

A first ASIC 301 and a second ASIC 302. The first ASIC 301 and the second ASIC 302 can be coupled using an example physical interconnect 100, or an equivalent thereof. The example physical interconnect 100 can be disposed using a package substrate 300a.

A first set of memory devices 301a, such as a first set of high-bandwidth memory devices (HBM), coupled to the first ASIC 301, and a second set of memory devices 302a, also such as HBM devices, coupled to the second ASIC 302. (It is also possible for at least one or more of the HBM devices to be coupled to both the first ASIC 301 and to the second ASIC 302, such as possibly using multiple physical interconnects 100.)

The first ASIC 301 can be coupled to each of the first set of memory devices 301a using an example physical interconnect 200, or an equivalent thereof and the physical interfaces 211 and 224 respectively. Similarly, the second ASIC 302 can be coupled to each of the second set of memory devices 302a using an example physical interconnect 200, or an equivalent thereof and the physical interfaces 211 and 224 respectively. Each physical interconnect 200 can be disposed using the package substrate 300a.

In one embodiment, the package 300 can be disposed so that the first ASIC 301 and the second ASIC 302 each are coupled to an external connection. For example, the external connection can include a relatively long-range coupling to outside of the substrate. Alternatively, the external connection can include a relatively long-range coupling to a device disposed to couple to outside the substrate.

In one embodiment, the package 300 can be disposed so that the first ASIC 301 and the second ASIC 302 are relatively close to one another within the package 300, using the package substrate 300a.

In one embodiment, the package 300 can also be disposed so that the first ASIC 301 is relatively separated from its associated HBMs 301a, and the second ASIC 302 is relatively separated from its associated HBMs 302a. This is possible because the physical interconnect (described with respect to FIGS. 2A-2B) using an organic substrate can cover a substantially longer distance than a physical interconnect using a silicon interposer.

For example, an ASIC chiplet might be approximately 33 mm on a side, an HBM chiplet might be approximately 11 mm on a side, and a physical interconnect using a silicon interposer might be 4 mm at most in length. This would allow only about three HBMs to be coupled to the ASIC on a side. With a substantially longer physical interconnect provided using the organic substrate, each HBM can be disposed substantially farther from the ASIC. This can allow a larger number of HBMs to be coupled to the ASIC using the physical interconnect. For example, as shown in the figure, the ASIC can be coupled to twice as many HBMs as it could be when using a silicon interposer.

In one embodiment, the HBM chiplets can be disposed in a staggered manner. Thus, the HBM chiplets can be disposed in an arrangement other than strictly linear, so that some HBM chiplets are closer and some are farther from the ASIC chiplet. This can have the effect that more HBM chiplets can be disposed on a substrate such as an organic substrate or a printed circuit board (PCB). Because each trace in the D2D physical interconnect can have a lower loss, the traces can be disposed to have a longer reach. The longer reach of the D2D physical interconnect can be used to allow more HBM chiplets to be coupled to the ASIC chiplet.

Moreover, the longer reach of the D2D physical interconnect can be used to coupled larger ASIC chiplets or to couple the ASIC chiplets at a greater distance. This can have the effect that each ASIC chiplet can dissipate more heat without affecting other HBM chiplets that are heat sensitive. This can have the effect that more chiplets can be disposed on a single PCB without providing excessive heat or otherwise requiring extensive cooling means.

Expandable Set of Additional Memory Devices

Figure 3B:
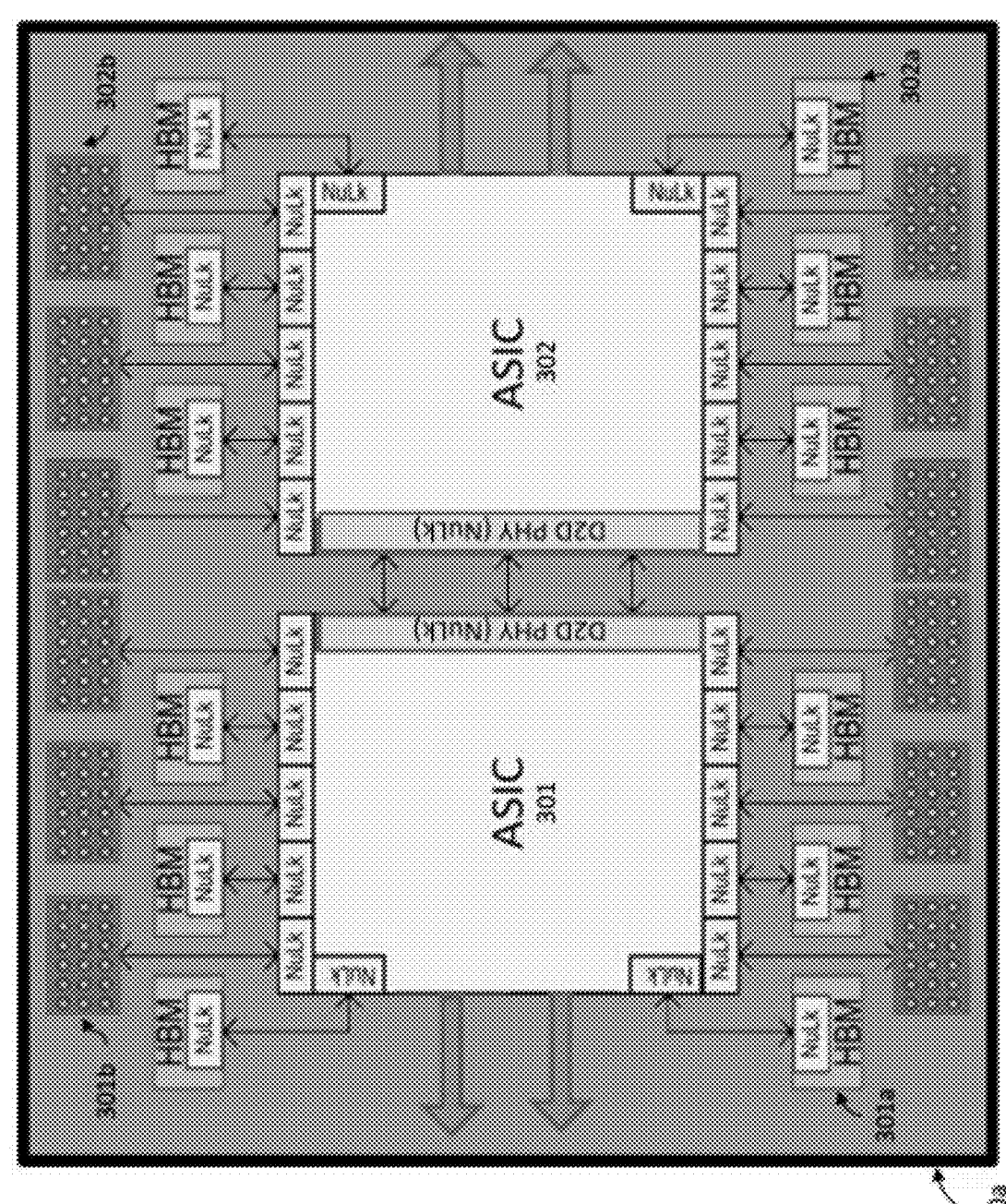
(FIG. 3B) an expandable set of additional memory devices and/or other circuit elements.

FIG. 3B shows a conceptual drawing of a system including multiple computing devices coupled to each other and to an expandable set of additional memory devices and/or other circuit elements.

In one embodiment, an alternative package 300 can include one or more of the following:

A first ASIC 301 and a second ASIC 302, similar to those described herein.

A first set of memory devices 301a and a second set of memory devices 302a, similar to those described herein.

A first set of expansion slots 301b, such as coupled to an elastomeric package, such as the package substrate 300a, or such as to a printed circuit board (PCB) 300b, coupled to the first ASIC 301, and a second set of expansion slots 302b, such as similarly coupled. The expansion slots 301b or 302b can be disposed to allow coupling of additional, new, or replacement circuits to the first ASIC 301 and/or the second ASIC 302. For example, the expansion slots 301b or 302b can be disposed to allow additional HBM devices 301a and/or 302a to be coupled to the ASICs 301 and/or 302. For another example, the expansion slots 301b or 302b can be disposed to allow other types of devices to be coupled to the ASICs 301 and/or 302.

As described above with respect to FIG. 3A, the package 300 can be disposed so that a bump pitch on the organic substrate is greater than 100 μm. This can provide that the first ASIC 301 can be coupled to its associated expansion slots 301*b*, and the second ASIC 302 can be coupled to its associated expansion slots 302*b*. Such associated expansion slots 301*b* are not generally possible with silicon interposers having micro bumps sized less than 100 um.

In one embodiment, the expansion slots 301*b* or 302*b* can each be coupled to an optical, electrical, or other external connection. For example, one or more of the expansion slots 301*b* or 302*b* can be coupled to an optical, electrical, or another type of connection to an external chiplet. Similarly, one or more of the expansion slots 301*b* or 302*b* can be coupled to an optical, electrical, or another type of connection to a device other than a chiplet, such as a device external to the substrate.

Hybrid Interfaces with External Pool of Other Devices

Figure 3C:
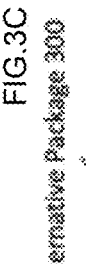
(FIG. 3C) a set of hybrid interfaces between one or more of the computing devices and an external pool of other devices.

FIG. 3C shows a conceptual drawing of a system including multiple computing devices coupled to each other and to a set of hybrid interfaces between one or more of the computing devices and an external pool of other devices.

In one embodiment, an alternative package 300 can include one or more of the following:

A first ASIC 301 and a second ASIC 302, similar to those described herein.

A first set of memory devices 301*a* and a second set of memory devices 301*a*, similar to those described herein.

A first set of external coupling devices 301*b*, coupled to the first ASIC 301, such as each disposed to be coupled to a communication link such as a terabits/second (Tbps) fiber link, couplable to an external memory or any other external device disposed to exchange information using such a link, and a second set of external coupling devices 302*b*, coupled to the second ASIC 302, such as similarly coupled. As shown in the figure, the external coupling devices 301*b* or 302*b* are disposed close to the edge of the MCM package, so the coupling of fiber and/or other external links are mechanically easier.

As described above with respect to FIG. 3A, the package 300 can be disposed so that the first ASIC 301 is relatively separated from its associated external coupling devices 301*b*, and the second ASIC 302 is relatively separated from its associated external coupling devices 302*b*. Similar to FIG. 3A, this is possible because the physical interconnect (described with respect to FIGS. 2A-2B) using an organic substrate can cover a substantially longer distance than a physical interconnect using a silicon interposer.

Coupling to Relatively Larger Set of Photonic Devices in a Staggered Topology

FIG. 3D shows a conceptual drawing of a multi-chip module (MCM) 310 including a computing device 320 coupled to a set of photonic devices 322 that are disposed in a staggered relationship to the computing device 320.

Further referring to FIG. 3D, for one embodiment, the computing device 320 takes the form of an ASIC that is mounted to a package substrate 324. The ASIC 320 includes "north" and "south" edge areas 326 and 328 that are formed with respective sets of interface circuits 330. For one embodiment, each interface circuit 330 takes the form of a UCIe interface circuit and supports communications between the ASIC and a given photonic device 322 along an associated long-reach link 332.

With continued reference to FIG. 3D, for one embodiment, each photonic device or chiplet 322 may take the form of any of the semiconductor device embodiments described with respect to FIGS. 2C-2E and includes an interface circuit

334 that is compatible with the interface circuit 330 of the ASIC. In an effort to increase an overall bandwidth of the MCM 310 while still minimizing the size of the MCM footprint, the photonic chiplets 322 are positioned such that adjacent chiplets 322 are staggered longitudinally from the ASIC 320. For one embodiment, a lateral center-to-center spacing of a first chiplet relative to an adjacent second chiplet is less than half a total width of the first chiplet and the second chiplet. In some embodiments, a combination of different chiplets in addition to or other than photonic chiplets may be included on the MCM 320. Such chiplets may include SerDes chiplets, gearbox chiplets, memory chiplets, or the like.

Generic Coupling to Relatively Larger Set of Chiplets in a Staggered Topology

Figure 3E:
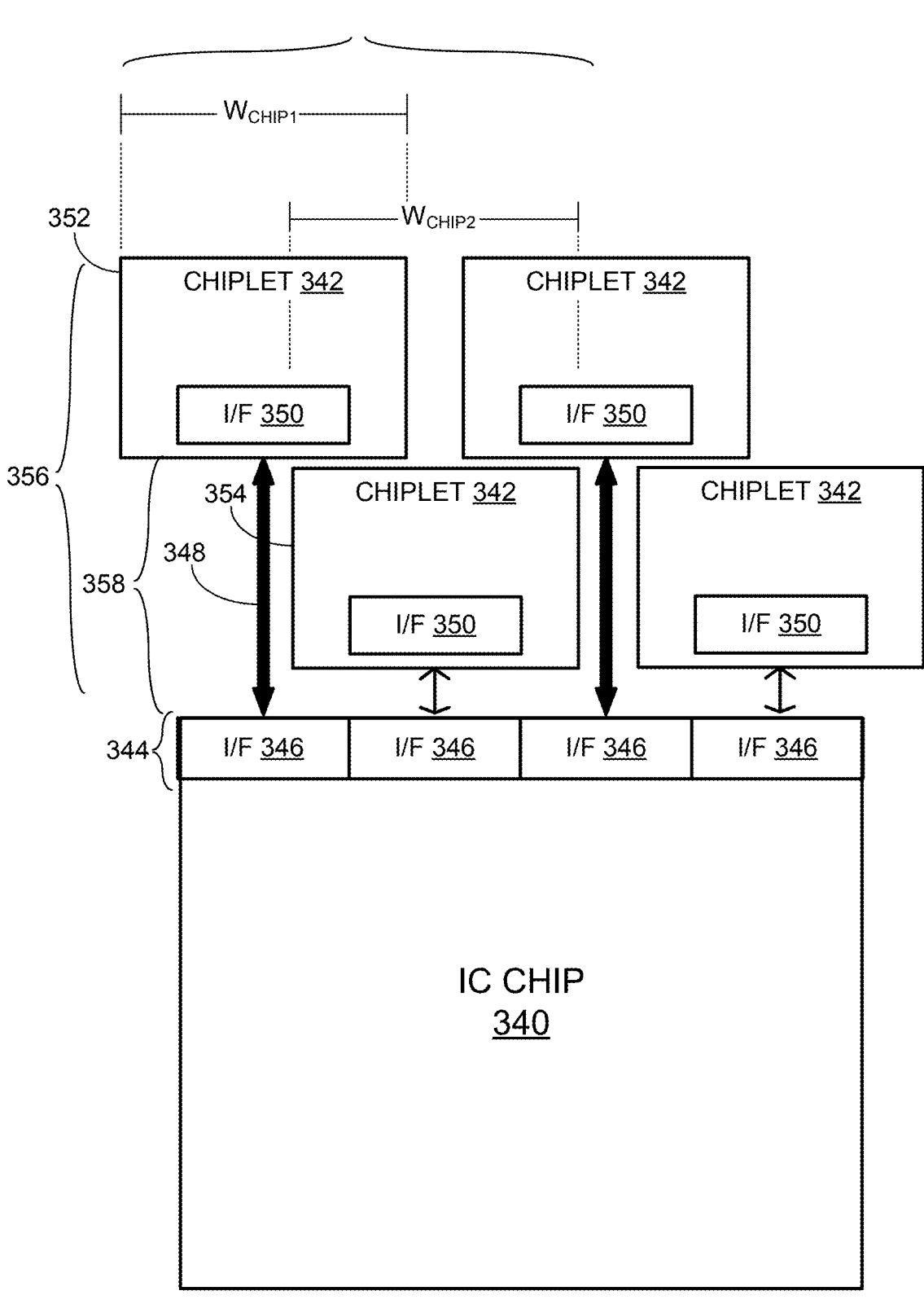
(FIG. 3E) a generic set of chiplets disposed in a staggered relationship to an IC chip.

FIG. 3E shows a conceptual drawing of an integrated circuit (IC) chip 340 coupled to a set of chiplets 342 that are disposed in a staggered relationship to the IC chip 340.

Further referring to FIG. 3E, for one embodiment, the IC chip 340 includes an input/output (I/O) edge area 344 that includes a set of interface circuits 346. For one embodiment, each interface circuit 346 takes the form of a UCIe interface circuit and supports communications between the IC chip 340 and a given chiplet 342 along an associated long-reach link 348. The IC chip 340, the chiplets 342 and the links 348 are all disposed on a package substrate (not shown) to form a multi-chip module (MCM).

With continued reference to FIG. 3E, for one embodiment, each chiplet 342 may take the form of any of the semiconductor device embodiments described with respect to FIGS. 2C-2E and includes an interface circuit 350 that is compatible with the interface circuit 346 of the IC chip 340. In an effort to increase an overall bandwidth of the MCM while still minimizing the size of the MCM footprint, the chiplets 342 are positioned such that adjacent chiplets, such as at 352 and 354, are staggered longitudinally from the IC chip 340. Thus, the chiplet 342, at 352, is disposed a first longitudinal distance 356 that is different than a second longitudinal distance, at 358, associated with the chiplet 342 at 354. Additionally, the chiplets are disposed laterally with respect to one another such that the first chiplet, at 352, and the second chiplet, at 354, are disposed in an at least partially laterally overlapping configuration with respect to each other. For one embodiment where the chiplets 342 are identical, the lateral overlapping results in a lateral center-to-center spacing of the chiplets that is less than half a total width of the first chiplet $W_{CHIP1}$ and the second chiplet $W_{CHIP2}$.

Coupling to Relatively Larger Set of Photonic Devices in a Fanout Topology

Figure 3F:
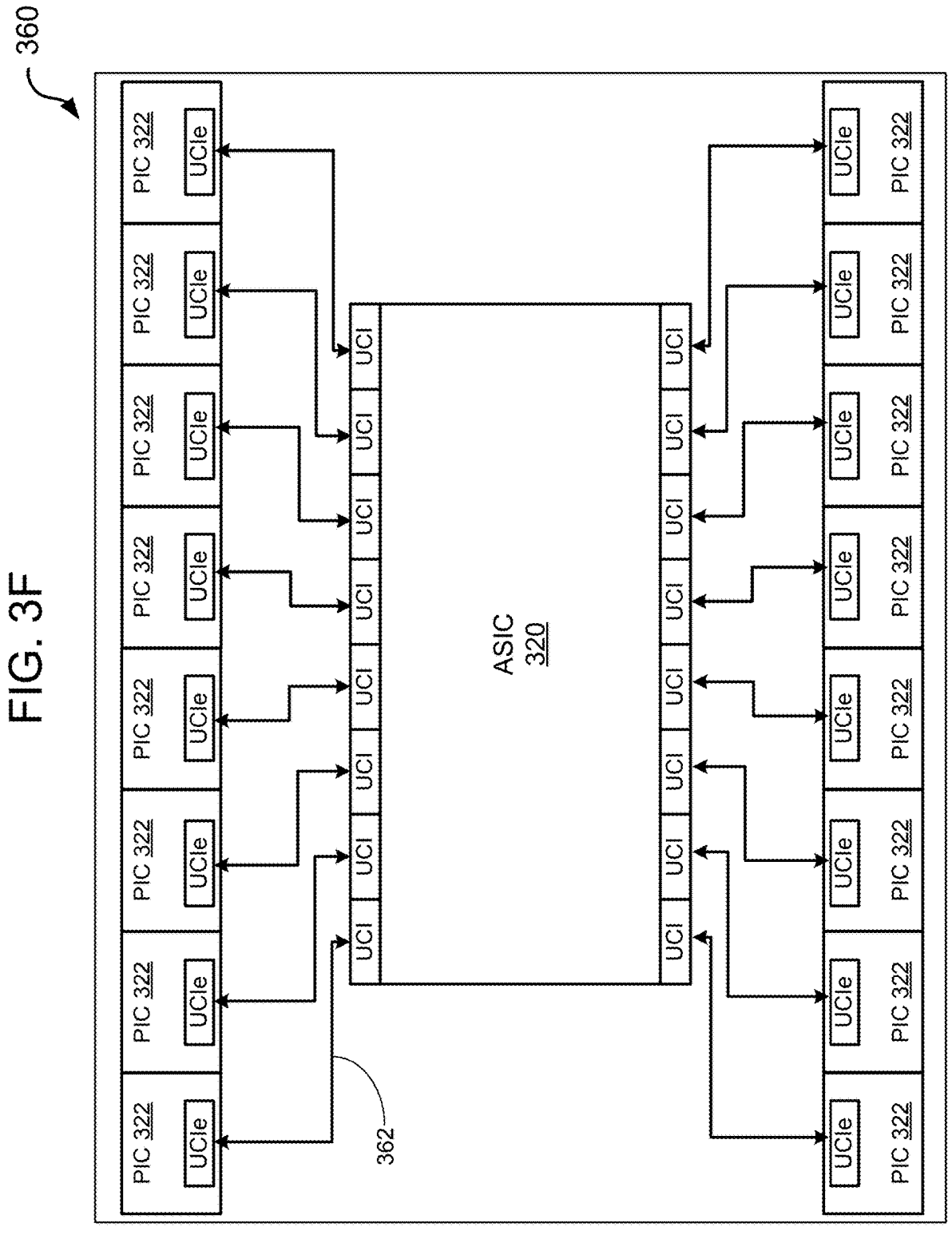
(FIG. 3F) a large number of photonic devices disposed in a fanout topology with staggered length interconnects.

FIG. 3F shows a conceptual drawing of a multi-chip module (MCM) 360 that is similar to the MCM 310 of FIG. 3D, including a computing device 320 coupled to a set of photonic devices 322 via a set of long-reach links 362 along a package substrate 324.

Further referring to FIG. 3F, for one embodiment, the photonic devices 322 are positioned in an "east" to "west" linear arrangement, with each photonic device being coupled to the ASIC 320 via a corresponding link 362. Due to the long-reach nature of the links 362, the photonic devices 322 may be positioned, if desired, further from the ASIC 320 than in the previously-described embodiments. Fanning out the photonic devices in this manner may allow for better coupling of fiber interconnects to the photonic devices 322. Additionally, by positioning the photonic devices 322 further from the ASIC 320, mechanical interference from vertically-oriented fiber interconnects may be avoided when installing a heat sink on the ASIC 320.

ALTERNATIVE EMBODIMENTS

While this Application primarily describes systems and techniques that primarily relate to physical layer interconnects between chips and/or chiplets, there is no requirement for any such limitation. After reading this Application, those skilled in the art will recognize that the techniques described herein are applicable to a wide variety of devices disposed to interconnect electronic circuitry or portions thereof. For example, the techniques described herein are applicable to a wide variety of different types of devices disposed to interconnect electronic circuitry or portions thereof, and to provide high-bandwidth and/or relatively low-power interconnects therebetween; or otherwise as described herein.

Moreover, after reading this Application, those skilled in the art will recognize that the techniques described herein are applicable to a wide variety of different types of devices which can computing devices, memory devices, specialized hardware/software devices such as tensor processing devices (TPUs), video processing devices (VPUs), and a wide variety of different types of electronic circuitry coupling.

This Application describes a preferred embodiment with preferred process steps and, where applicable, preferred data structures. After reading this Application, those skilled in the art would recognize that, where any calculation or computation is appropriate, embodiments of the description can be implemented using general purpose computing devices or switching processors, special purpose computing devices or switching processors, other circuits adapted to particular process steps and data structures described herein, or combinations or conjunctions thereof, and that implementation of the process steps and data structures described herein would not require undue experimentation or further invention.

The claims are incorporated into the specification as if fully set forth herein.

The invention claimed is:

1. A chiplet-based multi-chip module (MCM) to mount to a main substrate, comprising:
   a package substrate without an interposer, the package substrate separate from the main substrate;
   a first integrated circuit (IC) chiplet coupled to the package substrate and comprising a first interface beachfront of a first longitudinal length, the first interface beachfront formed along a first edge of the first IC chiplet and comprising a first set of die-to-die (D2D) interface circuits; and
   a first set of peripheral chiplets coupled to the package substrate in a first collinear fanout arrangement with respect to the first interface beachfront of the first IC chiplet, the first collinear fanout arrangement comprising a second longitudinal length that is longer than the first longitudinal length, the first set of peripheral chiplets coupled to the first set of D2D interfaces in a one-to-one relationship via a first set of long-reach links.

2. The chiplet-based MCM of claim 1, wherein:
   the first collinear fanout arrangement of the first set of peripheral chiplets defines a parallel spaced-apart relationship of the first set of peripheral chiplets with respect to the first set of D2D interfaces.

3. The chiplet-based MCM of claim 1, wherein:
   the first IC chiplet comprises a processing IC chiplet.

4. The chiplet-based MCM of claim 1, wherein:
   the first set of peripheral chiplets comprises multiple photonic IC chiplets.

5. The chiplet-based MCM of claim 1, wherein:
   the first set of peripheral chiplets comprises multiple memory chiplets.

6. The chiplet-based MCM of claim 5, wherein:
   each of the multiple memory chiplets comprises
   a base die; and
   a memory stack disposed on the base die.

7. The chiplet-based MCM of claim 6, wherein:
   the memory stack comprises a high-bandwidth memory (HBM) stack of dynamic random access memory (DRAM).

8. The chiplet-based MCM of claim 1, wherein:
   the first set of long-reach links are free to be different lengths.

9. The chiplet-based MCM of claim 8, wherein:
   the first set of long-reach links are of staggered lengths.

10. The chiplet-based MCM of claim 2, wherein:
    the first set of D2D interfaces comprises a first set of Universal Chiplet Interconnect Express (UCIe) D2D interfaces.

11. The chiplet-based MCM of claim 1, wherein:
    the first integrated circuit (IC) chiplet comprises a second interface beachfront of a third longitudinal length, the second interface beachfront formed along a second edge of the first IC chiplet and comprising a second set of die-to-die (D2D) interface circuits; and
    wherein the chiplet-based MCM further comprises a second set of peripheral chiplets coupled to the package substrate in a second collinear fanout arrangement with respect to the second interface beachfront of the first IC chiplet, the second collinear fanout arrangement comprising a fourth longitudinal length that is longer than the third longitudinal length, the second set of peripheral chiplets coupled to the second set of D2D interfaces in a one-to-one relationship via a second set of long-reach links.

12. A chiplet-based multi-chip module (MCM) to mount to a main substrate, comprising:
    a package substrate without an interposer, the package substrate separate from the main substrate;
    a first integrated circuit (IC) chiplet coupled to the package substrate and comprising a first set of die-to-die (D2D) interface circuits disposed proximate a first edge of the first IC chiplet and a second set of D2D interface circuits disposed proximate a second edge of the first IC chiplet;
    a first set of peripheral chiplets coupled to the first set of D2D interface circuits via a first set of links, the first set of links routed along a first set of traces of the package substrate;
    a second set of peripheral chiplets coupled to the second set of D2D interface circuits via a second set of links, the second set of links routed along a second set of traces of the package substrate; and
    wherein adjacent peripheral chiplets of the first set of peripheral chiplets are positioned in a first collinear fanout arrangement with respect to the first IC chiplet, and wherein adjacent peripheral chiplets of the second set of peripheral chiplets are positioned in a second collinear fanout arrangement with respect to the first IC chiplet.

13. The chiplet-based MCM of claim 12, wherein:

the first collinear fanout arrangement of the first set of peripheral chiplets defines a first parallel spaced-apart relationship of the first set of peripheral chiplets with respect to the first set of D2D interfaces; and the second collinear fanout arrangement of the second set of peripheral chiplets defines a second parallel spaced-apart relationship of the second set of peripheral chiplets with respect to the second set of D2D interfaces.

14. The chiplet-based MCM of claim 12, wherein:

the first IC chiplet comprises a processing IC chiplet.

15. The chiplet-based MCM of claim 12, wherein:

the first set of peripheral chiplets comprises multiple photonic IC chiplets.

16. The chiplet-based MCM of claim 12, wherein:

the first set of peripheral chiplets comprises multiple memory chiplets.

17. The chiplet-based MCM of claim 16, wherein:

each of the multiple memory chiplets comprises a base die; and a memory stack disposed on the base die.

18. The chiplet-based MCM of claim 17, wherein:

the memory stack comprises a high-bandwidth memory (HBM) stack of dynamic random access memory (DRAM).

19. The chiplet-based MCM of claim 12, wherein:

the first set of links and the second set of links are free to be different lengths.

20. The chiplet-based MCM of claim 19, wherein:

the first set of links and the second set of links are of staggered lengths.

21. The chiplet-based MCM of claim 12, wherein:

the first set of D2D interfaces and the second set of D2D interfaces comprise respective first and second sets of Universal Chiplet Interconnect Express (UCIe) D2D interfaces.

22. A method of operation in a chiplet-based multi-chip module (MCM), comprising:

interfacing, on a package substrate without an interposer, a first set of D2D interfaces of a first integrated circuit (IC) chiplet to a first set of peripheral chiplets via a first set of long-reach links, the interfacing of the first IC chiplet to the first set of peripheral chiplets comprising positioning adjacent peripheral chiplets of the first set of peripheral chiplets in a first collinear fanout arrangement with respect to the first IC chiplet;

interfacing, on the package substrate, a second set of D2D interfaces of the first IC chiplet to a second set of peripheral chiplets via a second set of long-reach links, wherein the interfacing of the first IC chiplet to the second set of peripheral chiplets comprises positioning adjacent peripheral chiplets of the second set of peripheral chiplets in a second collinear fanout arrangement with respect to the first IC chiplet.

23. The method of claim 22, wherein:

the first collinear fanout arrangement of the first set of peripheral chiplets defines a first parallel spaced-apart relationship of the first set of peripheral chiplets with respect to the first set of D2D interfaces; and the second collinear fanout arrangement of the second set of peripheral chiplets defines a second parallel spaced-apart relationship of the second set of peripheral chiplets with respect to the second set of D2D interfaces.

* * * * *